(12) United States Patent
Jhan et al.

(10) Patent No.: US 12,298,628 B2
(45) Date of Patent: May 13, 2025

(54) ELECTRONIC DEVICE HAVING SEALING STRUCTURE

(71) Applicant: Innolux Corporation, Miao-Li County (TW)

(72) Inventors: Fiona Jhan, Pingtung (TW); Lavender Cheng, Tainan (TW)

(73) Assignee: Innolux Corporation, Miao-Li County (TW)

(*) Notice: Subject to any disclaimer, the term of this patent is extended or adjusted under 35 U.S.C. 154(b) by 0 days.

(21) Appl. No.: 18/592,145

(22) Filed: Feb. 29, 2024

(65) Prior Publication Data
US 2024/0201543 A1   Jun. 20, 2024

Related U.S. Application Data

(63) Continuation of application No. 17/964,761, filed on Oct. 12, 2022, now Pat. No. 11,947,222, which is a continuation of application No. 16/944,149, filed on Jul. 31, 2020, now Pat. No. 11,500,248.

(51) Int. Cl.
*G02F 1/1339* (2006.01)
*G02F 1/1343* (2006.01)
*H05K 1/02* (2006.01)
*H05K 1/14* (2006.01)

(52) U.S. Cl.
CPC ...... *G02F 1/1339* (2013.01); *G02F 1/134309* (2013.01); *H05K 1/0296* (2013.01); *H05K 1/14* (2013.01); *G02F 1/134372* (2021.01); *G02F 1/13439* (2013.01)

(58) Field of Classification Search
CPC .......... H05K 1/02; H05K 1/0296; H05K 1/14; H05K 1/141–147; G02F 1/133; G02F 1/1339; G02F 1/13439
USPC ........ 361/749–750, 767, 770–778, 792–795, 361/803; 174/250–258, 350–352; 349/149–151, 199–200
See application file for complete search history.

(56) References Cited

U.S. PATENT DOCUMENTS

| | | | | |
|---|---|---|---|---|
| 7,538,488 B2* | 5/2009 | Kwak | ........... | H10K 59/8722 313/506 |
| 9,564,608 B2* | 2/2017 | Sato | ........... | H10K 50/115 |
| 2014/0154818 A1* | 6/2014 | Shimamura | ........... | H10K 50/805 438/4 |
| 2016/0204171 A1* | 7/2016 | Lee | ........... | H10K 50/824 438/34 |
| 2017/0269405 A1* | 9/2017 | Hirota | ........... | G02F 1/1339 |
| 2018/0006267 A1* | 1/2018 | Sakamoto | ........... | H10K 50/8426 |
| 2018/0217423 A1* | 8/2018 | Suzuki | ........... | G02F 1/1337 |
| 2019/0373226 A1* | 12/2019 | Ishikawa | ........... | G02F 1/13452 |

(Continued)

*Primary Examiner* — Tuan T Dinh
(74) *Attorney, Agent, or Firm* — Patterson + Sheridan, LLP

(57) ABSTRACT

An electronic device is provided. The electronic device includes a substrate having an edge and a peripheral area adjacent to the edge, a first inorganic insulating layer disposed on the first substrate, an organic insulating layer disposed on the first inorganic insulating layer and including a recess in the peripheral area, and a second inorganic insulating layer disposed on the organic insulating layer and in the recess. In a top view, the recess extends in a first direction parallel to the edge of the substrate. In a cross-sectional view, the recess has a bottom portion adjacent to the substrate, and a width of the bottom portion of the recess is greater than a thickness of the organic insulating layer.

7 Claims, 9 Drawing Sheets

(56) References Cited

U.S. PATENT DOCUMENTS

2020/0159051 A1* 5/2020 Pan .................. G02F 1/133512
2020/0227661 A1* 7/2020 Nishikiori ............. H10K 71/00

* cited by examiner

ELECTRONIC DEVICE HAVING SEALING STRUCTURE

CROSS REFERENCE TO RELATED APPLICATIONS

This application is a Continuation of U.S. patent application Ser. No. 17/964,761, filed on Oct. 12, 2022, which is a Continuation of U.S. patent application Ser. No. 16/944,149, now U.S. Pat. No. 11,500,248 B2, filed on Jul. 31, 2020, and entitled "SEALING STRUCTURE AND AN ELECTRONIC DEVICE HAVING THE SAME", the entirety of which are incorporated by reference herein.

BACKGROUND OF THE DISCLOSURE

Field of the Disclosure

The disclosure relates to an electronic device having a sealing structure.

Description of the Related Art

Nowadays, electronic devices such as notebooks, mobile phones, digital cameras, personal digital assistants, etc. have become an indispensable part for humans. In electronic devices, a sealing structure is usually provided at its frame to protect various electronic elements in the electronic devices. However, as the thickness of the frame of the electronic device decreases, the bonding strength between the frame and other elements also decreases. Therefore, how to increase the mechanical strength at the frame has become an important issue.

BRIEF DESCRIPTION OF THE DISCLOSURE

An electronic device is provided. The electronic device includes a substrate having an edge and a peripheral area adjacent to the edge, a first inorganic insulating layer disposed on the first substrate, an organic insulating layer disposed on the first inorganic insulating layer and including a recess in the peripheral area, and a second inorganic insulating layer disposed on the organic insulating layer and in the recess. In a top view, the recess extends in a first direction parallel to the edge of the substrate. In a cross-sectional view, the recess has a bottom portion adjacent to the substrate, and a width of the bottom portion of the recess is greater than a thickness of the organic insulating layer.

BRIEF SUMMARY OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
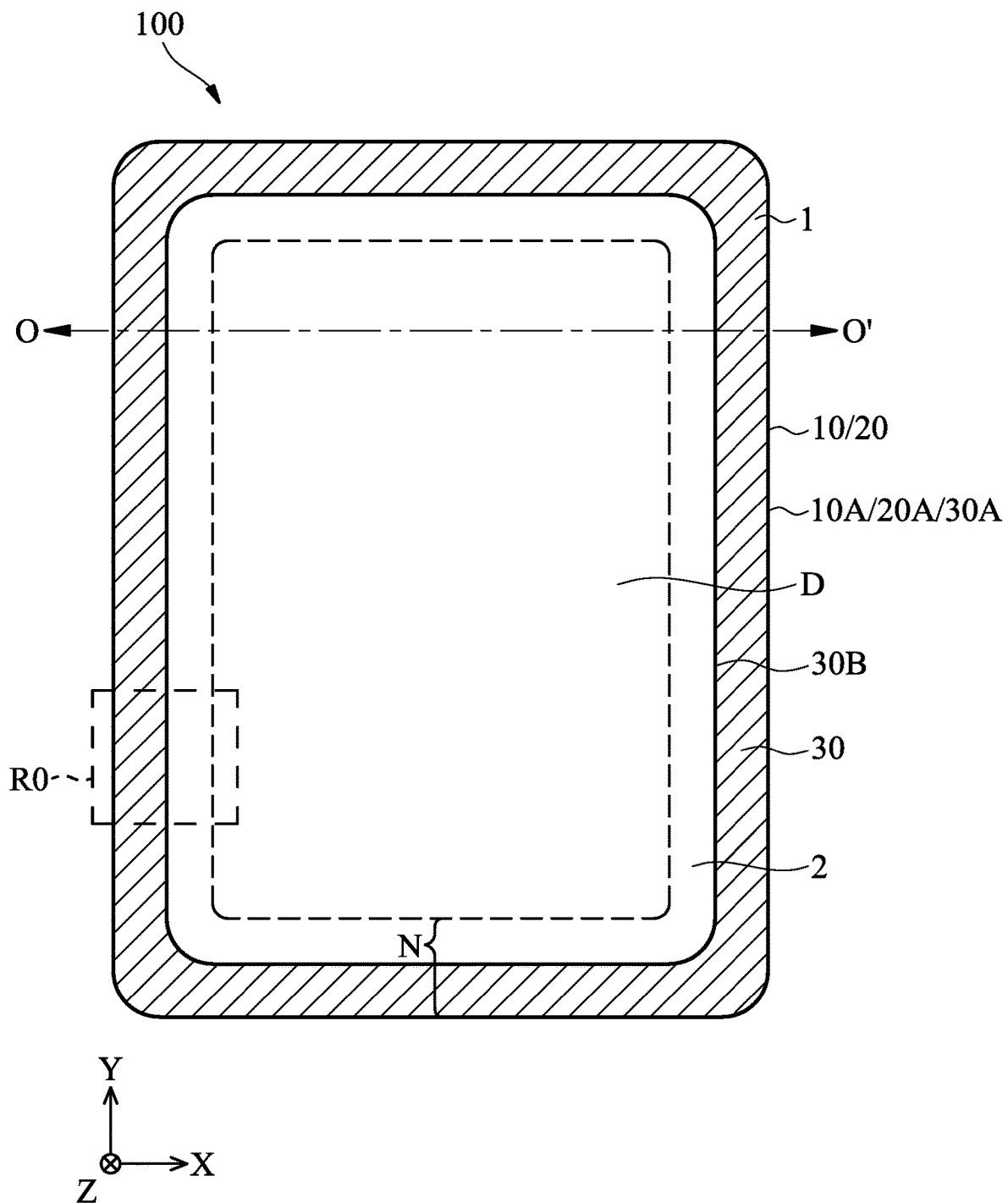
FIG. 1A is a top view of an electronic device in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature disposed over or formed on a second feature in the description that follows may include embodiments in which the first and second features are in direct contact, and may also include embodiments in which additional features may be disposed between the first and second features, such that the first and second features may not be in direct contact. If the formation of a first feature directly disposed over or formed on a second feature in the description, it represents the embodiments that the first feature is in direct contact with the second feature.

In addition, the present disclosure may repeat reference numerals and/or letters in the various examples. This repetition is for the purpose of simplicity and clarity, and does not in itself dictate a relationship between the various embodiments and/or configurations discussed. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The terms "about" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

In addition, in some embodiments of the present disclosure, terms concerning attachments, coupling and the like, such as "connected" and "interconnected", which refer to a relationship wherein structures are secured or attached to one another either directly or indirectly through intervening structures, as well as both movable or rigid attachments or relationships, unless expressly described otherwise.

Referring to FIG. 1A, which is a top view of an electronic device 1001 in some embodiments of the present disclosure. The top view direction in the present disclosure may be defined as Z direction. In some embodiments, the electronic device 1001 may be, for example, a display device, an antenna device, a sensing device, touch display device, a curved display device, or a free shape display device, and may be a bendable or flexible tiled electronic device, but it is not limited thereto. For example, the electronic device 1001 may include a light emitting diode (LED), liquid crystal, fluorescence, phosphor, other suitable display medias, or a combination thereof, but it is not limited thereto. The light emitting diode (LED) may be, for example, organic light emitting diode (OLED), inorganic light-emitting diode, mini LED, micro LED, or quantum dot (QD) light emitting diode (e.g. QLED, QDLED), other suitable materials or a combination thereof, but it is not limited thereto. The antenna device may be a liquid crystal antenna, but it is not limited thereto. It should be noted that the electronic device may be a combination of the aforementioned devices, but it is not limited thereto. Furthermore, the shape of the electronic device may be rectangular, circular, polygonal, a shape having curved edges or other suitable shapes. In some embodiments, the electronic device may include a driving system, a control system, a light source system, a shelf system, or other periphery systems to support the display device or the antenna device.

Figure 1B:
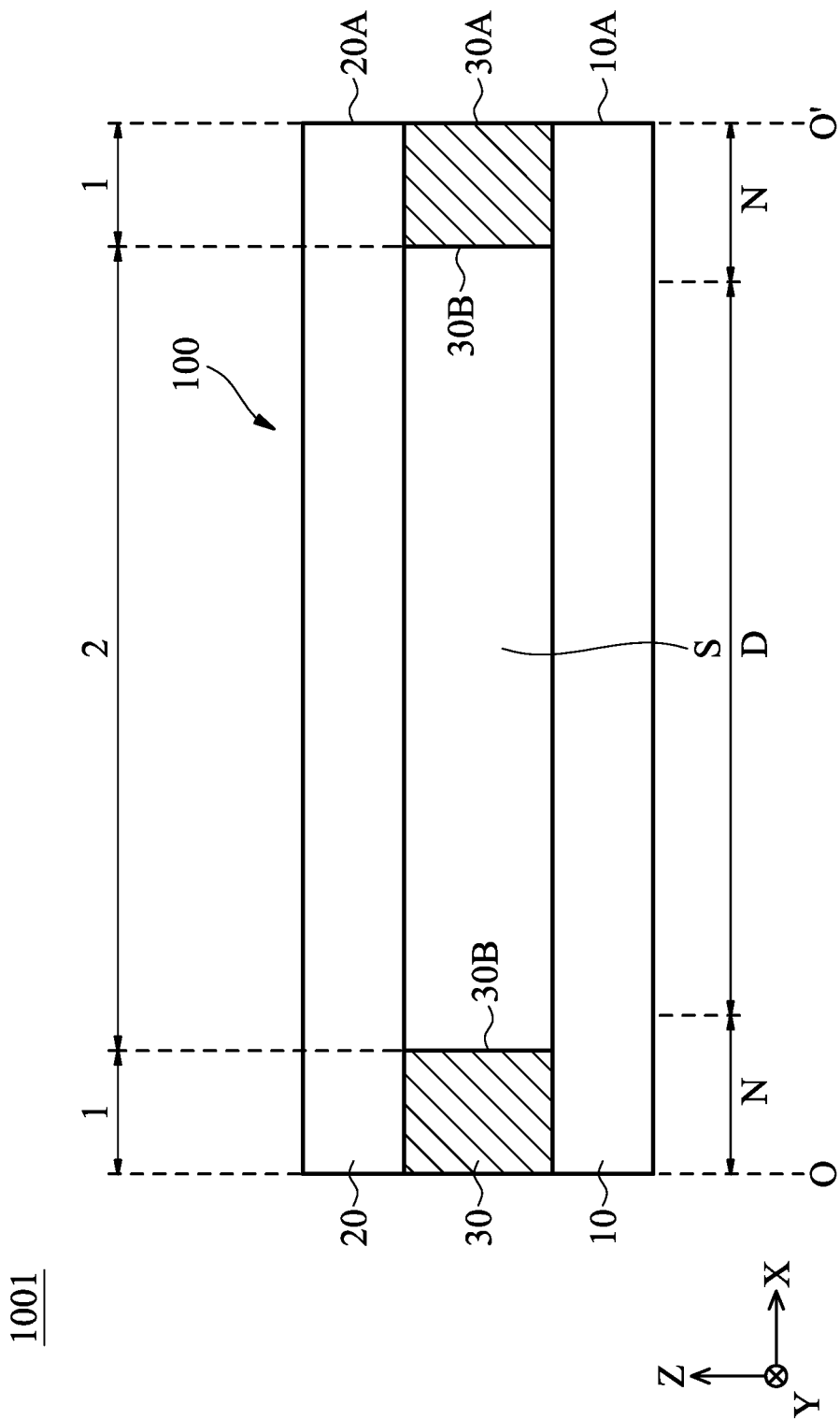
FIG. 1B is a cross-sectional view of the electronic device in some embodiments of the present disclosure.

Refer to FIG. 1A, wherein the electronic device 1001 includes a sealing structure 100. The sealing structure 100 may include sealing material 30, a substrate 10, and a substrate 20. Each of the substrate 10 and the substrate 20 includes a display area D and a periphery N. In an embodiment, the periphery N of the substrate 10 and/or the substrate 20 includes a sealant region 1 and a portion of non-sealant region 2. In other words, the periphery N includes the sealant region 1 and a region outside the display area D. In another embodiment, the sealant region 1 may be called as a sealing region, and the non-sealant region 2 is disposed adjacent to the sealing region. In detail, a region between an inner edge 30B of the sealing material 30 and an edge 20A of the substrate 20 and/or an edge 10A of the substrate 10 refers to the sealing region, and the region outside the sealing region is called as the non-sealant region 2. FIG. 1B is a cross-sectional view illustrated along the line O—O' in FIG. 1A. As shown in FIG. 1B, the substrate 10 is opposite to the substrate 20, and the sealing material 30 is positioned between the substrate 10 and the substrate 20. The sealing material 30 is disposed along the periphery N to seal the substrate 10 and the substrate 20. For example, the sealing material 30 may be positioned at the sealant region 1 to surround the non-sealant region 2. In other words, the region that corresponds to the sealing material 30, such as the region that overlaps the sealing material 30 in Z direction, may be referred to as the sealant region 1, so that a space S is formed between the substrate 10, the substrate 20, and the sealing material 30.

In some embodiments, the sealing material 30 may extend to the edge 10A of the substrate 10 and/or the edge 20A of the substrate 20A, but it is not limited thereto. For example, as shown in FIG. 1B, in a normal direction of the substrate 10 or the substrate 20 (Z direction), an outer edge 30A of a portion of the sealing material 30 may substantially align with the edge 10A of the substrate 10 and/or the edge 20A of the substrate 20, but the present disclosure is not limited thereto. Therefore, the thickness of the bezel of the electronic device 1001 may be reduced. In another embodiment, the outer edge 30A of the sealing material 30 does not align with the edge 10A of the substrate 10 and/or the edge 20A of the substrate 20, and the outer edge 30A of the sealing material 30 does not extend exceed the edge 10A of the substrate 10 and/or the edge 20A of the substrate 20. For example, the outer edge 30A of the sealing material 30 may retract from the edge 10A of the substrate 10 and/or the edge 20A of the substrate 20 to the non-sealant region 2. In other words, referring to FIG. 1A, in the top view, the outer edge 30A of the sealing material 30 may position between an inner edge 30B of the sealing material 30 and the edge 10A of the substrate 10 and/or the edge 20A of the substrate 20, so the manufacturing speed of the electronic device 1001 may be increased.

In some embodiments, the sealing material 30 may include, for example, epoxy resin, hardener, stabilizer, toughening agent, thixotropic agent, defoaming agent, coupling agent, dispersant, or a combination thereof, but it is not limited thereto.

In some embodiments, display media or working media may be disposed in the space S. For example, the display media or the working media may be liquid crystal, an organic light emitting layer, and inorganic light emitting layer, a quantum dot layer, etc., but it is not limited thereto.

Figure 2A:
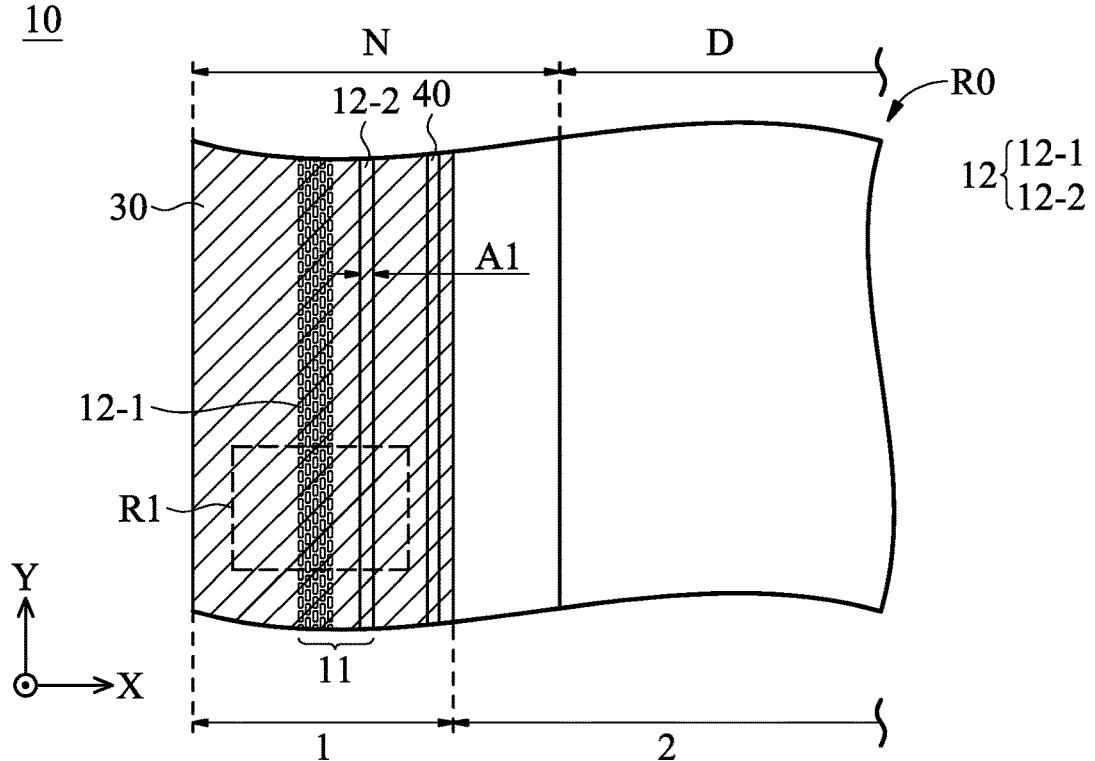
FIG. 2A is a top view of some elements of a sealing structure in some embodiments of the present disclosure.
Figure 2B:
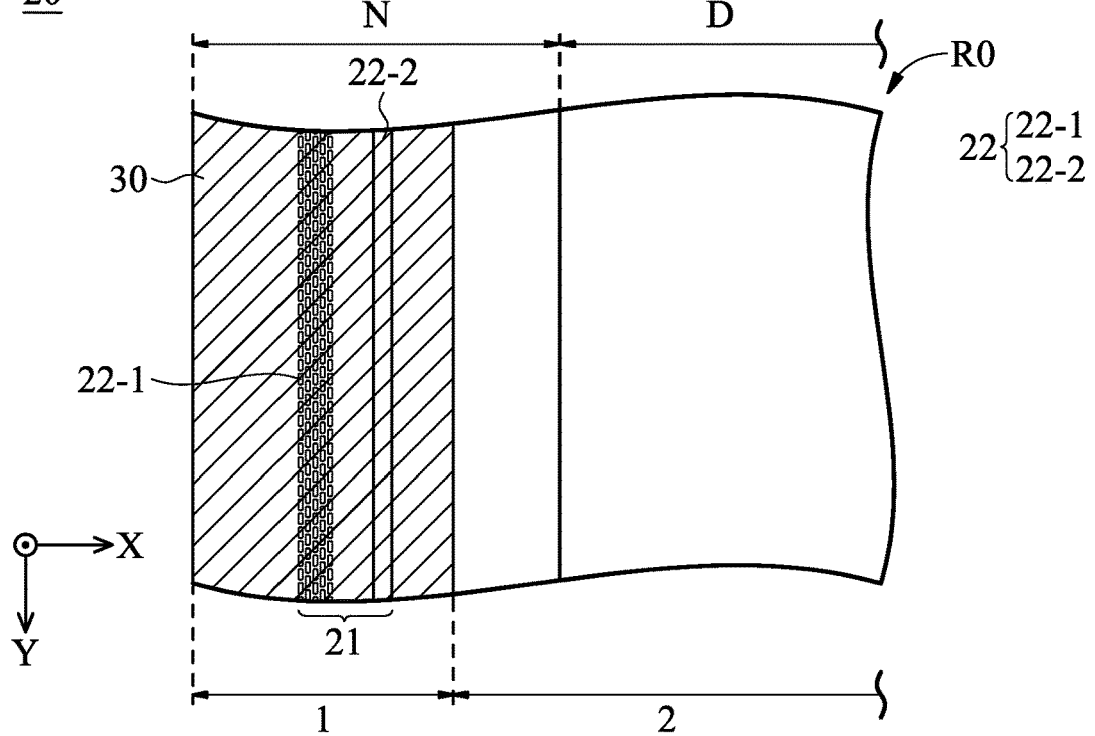
FIG. 2B is a bottom view of some elements of the sealing structure in some embodiments of the present disclosure.

FIG. 2A is an enlarged view of a region R0 in FIG. 1A. FIG. 2B is a top view of the region R0 in FIG. 1A. As shown in FIG. 2A, taking the substrate 10 as an example, the substrate 10 may include a display area D and a periphery N. The periphery N includes the sealant region 1 and a portion of the non-sealant region 2. In another embodiment, referring to FIG. 2A and FIG. 2B, the sealant region 1 may be a region where the sealing material 30 is disposed at. In an embodiment, additional wiring 40 may be disposed on the periphery N of the substrate 10 and/or the substrate 20, such as disposed in the sealant region 1, and the sealing material 30 may partially or totally overlap the wiring 40 when viewed from the top view direction (e.g. along the Z direction) to transfer the electric signal of the electronic elements in the sealing structure 100. IN another embodiment, the wiring 40 may be at least partially disposed in the non-sealant region 2 of the periphery N. In some embodiments, the substrate 10 and/or the substrate 20 may include thin film transistors, such as a top-gate thin film transistor, a bottom-gate thin film transistor, or a double-gate thin film transistor that includes amorphous silicon, low temperature poly-silicon (LTPS) or metal oxide, but it is not limited thereto.

In some embodiments, the sealing structure 100 may include a recess structure 11, and at least a portion of the recess structure 11 or the entire recess structure 11 is positioned in the sealant region 1. The recess structure 11 may include at least one recess 12, but it is not limited thereto. The recess 12 may include a recess 12-1 or a recess 12-2. Moreover, the terms "recess" and "recess structure" may include a feature that recesses from a surface but not penetrates the entire structure, or a feature that penetrates the entire structure, such as holes, and it is not limited thereto. In this embodiment, the recess structure 11 may include at least one recess 12-1 positioned on at least one side of the substrate 10, or the recess structure 11 may include a plurality of recesses 12-1 that are staggered or periodically arranged, and positioned on at least one side of the substrate 10. In another embodiment, the recess structure 11 may include at least one recess 12-2 positioned on at least one side of the substrate 10. In a further embodiment, the recess structure 11 may include at least one recess 12-1 and at least one recess 12-2. In an embodiment, a maximum width A1 of the recess 12-2 in the first direction (e.g. X direction) may be greater than or equal to 7.5 μm, and less than or equal to 73 μm in the top view.

The sealing material 30 may be disposed on the substrate 10. For instance, the sealing material 30 may be filled into the recess 12, but it is not limited thereto. Thanks to a design that provides a recess structure 11 in the sealant region 1, the contact area between the substrate 10 and the sealing material 30 may be increased to enhance the bonding strength between the substrate 10 or the substrate 20 and the sealing material 30, so that the mechanical strength of the sealing structure 100 may be increased.

Referring to FIG. 2B, the sealing material 30 is also disposed on the substrate 20, such as directly or indirectly in contact with the substrate 20. In some embodiments, a recess structure 21 may selectively disposed on the substrate 20, and at least a portion of the recess structure 21 or the entire recess structure 21 is positioned in the sealant region 1 of the periphery N of the substrate 20. The recess structure 21 may include at least one recess 22. The recess 22 may include a recess 22-1 or a recess 22-2. In this embodiment, the recess structure 22 may include at least one recess 22-1 positioned on at least one side of the substrate 20, or the recess structure 22 may include a plurality of recesses 22-1 that are staggered or periodically arranged, and are positioned on at least one side of the substrate 20. In another embodiment, the recess structure 21 may include at least one recess 22-2 positioned on at least one side of the substrate 20. In a further embodiment, the recess structure 21 may include at least one recess 22-1 and at least one recess 22-2. In some embodiments, as shown in FIG. 2A and FIG. 2B, identical or different structure may be disposed on the substrate 10 or the substrate 20, but they are not limited thereto. Furthermore, the recess structure may be provided on one of the substrates, such as the recess structure may be disposed on one of the substrate 10 or the substrate 20, and does not disposed on another one, depending on design requirements. By providing the recess structure 21 on the substrate 20, the contact area between the substrate 20 and the sealing material 30 may be increased to enhance the bonding strength, so that the mechanical strength of the sealing structure 100 may be increased.

Figure 3:
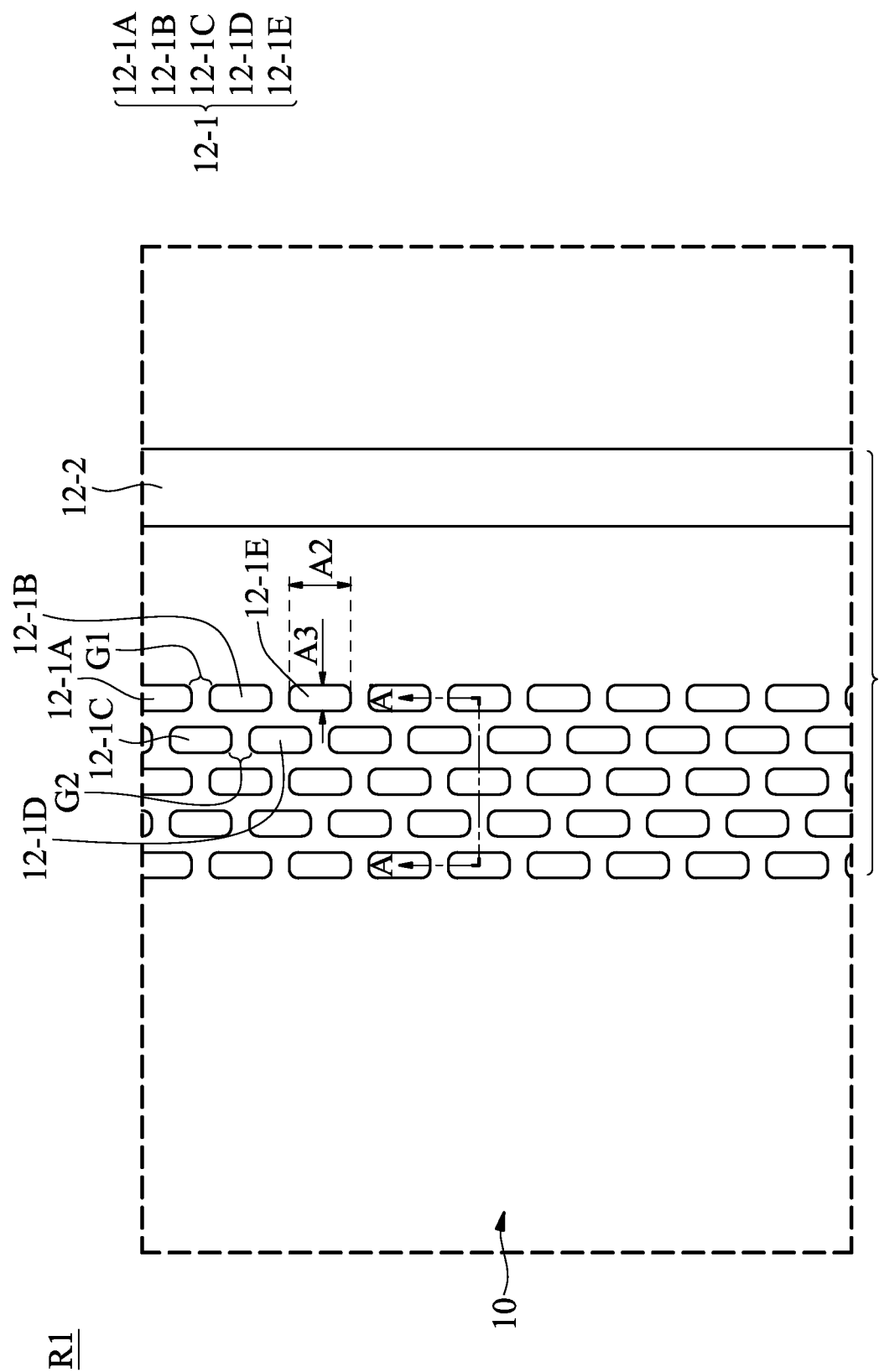
FIG. 3 is an enlarged view of the region R1 in FIG. 2A.

FIG. 3 is an enlarged view of the region R1 in FIG. 2A. In this embodiment, the number of the recesses 12-1 may be more than one, and the recesses 12-1 in FIG. 3 are illustrated as recess 12-1A to recess 12-E for convenience. The recesses 12-1 may be arranged in a plurality of rows in the Y direction, and the recesses 12-1 may be arranged in a staggered manner in the X direction. For example, recess 12-1A and recess 12-1B are arranged in one row in the Y direction, and recess 12-1C and recess 12-1D are arranged in another row in the Y direction. The row including recess 12-1A and recess 12-1B is separate from and staggered with the row including recess 12-1C and recess 12-1D in the X direction. For example, a gap G1 may be formed between the recess 12-1A and the recess 12-1B in Y direction, and the gap G1 at least partially overlaps the recess 12-1C or the recess 12-1D.

Alternatively, in some embodiments, a gap G2 may be formed between recess 12-1C and recess 12-1D, and the gap G2 at least partially overlaps recess 12-1A or recess 12-1B, or recess 12-1A and recess 12-1B are not totally aligned with recess 12-1C and recess 12-1D in the X direction, but it is not limited thereto. Referring to FIG. 1B and FIG. 3, the staggered arrangement of the recesses 12-1 may increase the propagating length of the crack generated from the edge of the sealing structure 100, such as edge 10A. As a result, the chance of the crack propagating to the non-sealant region 2 may be decreased, so that the mechanical strength of the sealing structure 100 in the sealant region 1 may be increased. In an embodiment of the present disclosure, a ratio of the maximum width of at least one of the recesses in the second direction and the maximum width of at least one of the recesses in the first direction is greater than or equal to 0.5, and less than or equal to 0.4. In detail, a ratio between the maximum width of the any of the recesses 12-1 in Y direction to the maximum width of the recess 12-1 in the X direction may be greater than or equal to 0.5, and less than or equal to 4 in the top view. For example, refer to FIG. 3, the maximum width of any of the recesses (such as the recess 12-1E) in the second direction (e.g. the Y direction) may be, for example, width A2, and the maximum width of the recess 12-1E in the first direction (e.g. the X direction) may be, for example, width A3. The ratio of the width A2 to the width A3 may be greater than or equal to 0.5, and less than or equal to 4. In this disclosure, the first direction is different from the second direction. In an embodiment, the first direction may be perpendicular to the second direction.

Although the length of the gap G1 or the gap G2 may be less than the maximum width of the recess 12-1A, the recess 12-1B, the recess 12-1C, the recess 12-1D, or the recess 12-1E in the Y direction, the present disclosure is not limited thereto. In some embodiments, the size of the gap G1 or the gap G2 may be greater than the size of the recess 12-1A, the recess 12-1B, the recess 12-1C, the recess 12-1D, or the recess 12-1E in the Y direction, depending on design requirements. Furthermore, in some embodiments, in a direction (such as the Y direction), the length of the gap G1 may be substantially identical to the length of the gap G2, but it is not limited thereto.

Figure 4:
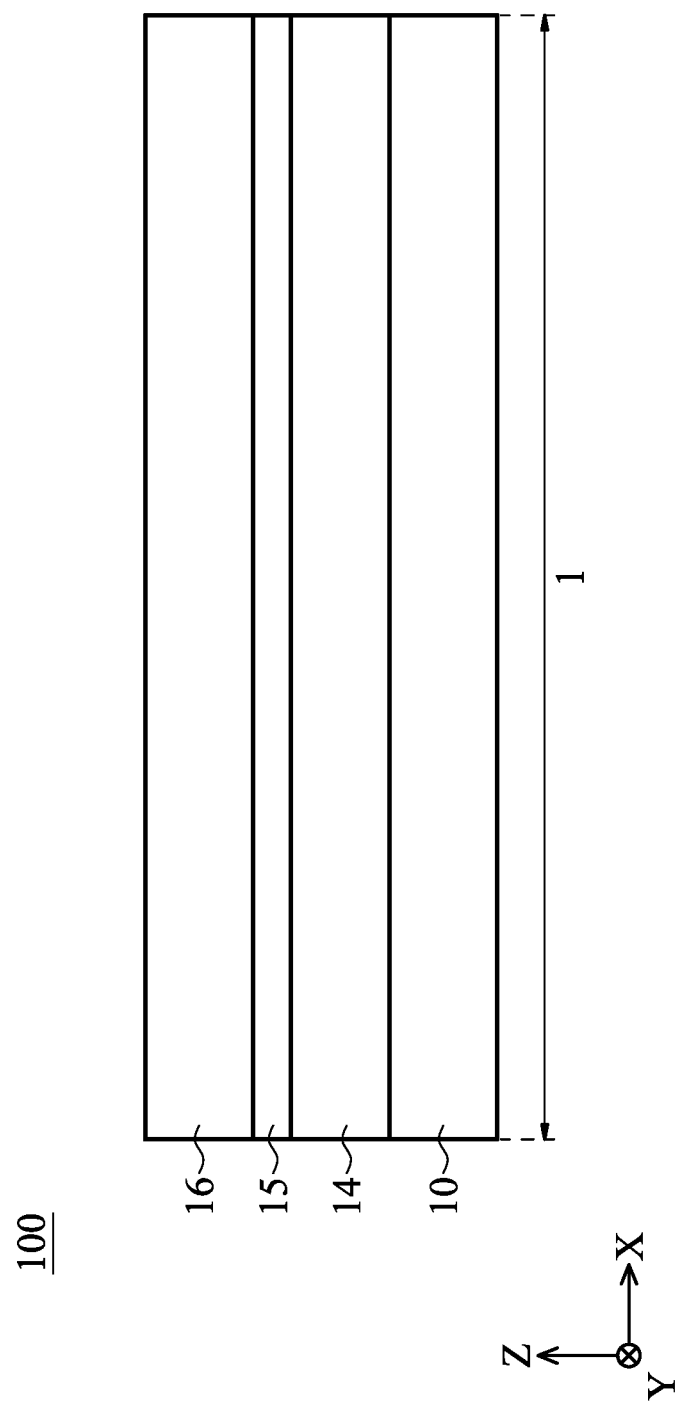
FIG. 4 is a cross-sectional view of a substrate and the structure on the substrate in a sealing region in some embodiments of the present disclosure.

FIG. 4 is a cross-sectional view of other layers disposed on the substrate 10 in the sealant region 1. Referring to FIG. 4, the sealing structure 100 may further include a first functional layer 14, an insulating layer 15, and/or a second functional layer 16, or other layers depending on structural design. The first functional layer 14, the insulating layer 15, and/or the second functional layer 16 or other layers depending on structural design may be disposed on the substrate 10 and/or the substrate 20. In an embodiment, the insulating layer 15 may be disposed on the substrate 10. In another embodiment, thin film transistors, a metal layer, a wiring layer, or other elements and metal layers may be disposed on the substrate 10. In some embodiments, the material of the substrate 10 may include glass, quartz, ceramic, sapphire, polycarbonate (PC), polyimide (PI), polypropylene (PP), polyethylene terephthalate (PET), other suitable materials, or a combination thereof, but it is not limited thereto. The substrate 10 may be flexible or inflexible material.

The aforementioned layers or elements are omitted in FIG. 1A and FIG. 1B for clarity. The first functional layer 14 is disposed between the insulating layer 15 and the substrate 10, and the second functional layer 16 is disposed on the insulating layer 15. The insulating layer 15 is disposed between the first functional layer 14 and the second functional layer 16. In an embodiment, the sealing material 30 in FIG. 1 may be direct in contact with the second functional layer 16, but it is not limited thereto.

In some embodiments, the first functional layer 14 may include at least one layer of buffer layer and gate insulating layer. For example, the buffer layer may be disposed between the substrate 10 and the gate insulating layer.

Moreover, in some embodiments, the buffer layer and/or the gate insulating layer may include more than one sublayer, but it is not limited thereto.

In some embodiments, the first functional layer 14 may be formed on the substrate 10 by physical vapor deposition process (PVD), chemical vapor deposition (CVD), coating process, other suitable methods, or a combination thereof. The physical vapor deposition process may include, for example, a sputtering process, an evaporation process, or pulsed laser deposition, but is not limited. The chemical vapor deposition process may include, for example, a low-pressure chemical vapor deposition process (LPCVD), a low-temperature chemical vapor deposition process (LTCVD), a rapid-thermal chemical vapor deposition process (RTCVD), a plasma-enhanced chemical vapor deposition process (PECVD), or atomic layer deposition process (ALD), etc., but it is not limited thereto.

In some embodiments, the material of the first functional layer 14 may include an insulating material, but it is not limited thereto. In some embodiments, the first functional layer 14 may include organic materials, inorganic materials, or a combination thereof, but it is not limited thereto. The aforementioned organic material may include polyethylene terephthalate (PET), polyethylene (PE), polyethersulfone (PES), polycarbonate (PC), polymethyl methacrylate (PMMA), isoprene, phenol-formaldehyde resin, benzocyclobutene (BCB), perfluorocyclobutane (PECB), or a combination thereof, but it is not limited thereto. In some embodiments, the aforementioned inorganic material may include silicon oxide, silicon nitride, silicon oxynitride, aluminum oxide, aluminum nitride, aluminum oxynitride, titanium oxide, other suitable materials, or include a combination thereof, but it is not limited thereto.

Referring to FIG. 1B and FIG. 4, in some embodiments, for example, the first functional layer 14 in the non-sealant region 2 of the display area D or the periphery N may be positioned between two metal layers (not shown), such as between a gate layer and a source layer, and then extended to the sealant region 1 of the periphery N. By providing the first functional layer 14 with the buffer layer, water and oxygen molecules can be reduced from entering the sealing structure 100, or the probability of contamination caused by ion diffusion on the substrate 10 can be reduced.

In some embodiments, the material of the insulating layer 15 may include organic materials, such as polyimide (PI), polyethylene terephthalate (PET), polyethylene (PE), polyether sulfone (PES), polycarbonate (PC), polymethyl methacrylate (PMMA), isoprene, phenolic resin, benzocyclobutene (BCB), perfluorocyclobutane (PECB), or a combination thereof, but it is not limited thereto. In some embodiments, the insulating layer 15 may be disposed on the first functional layer 14 by a process that is identical or similar to the one used in the first functional layer 14, which will not be repeated here.

In one embodiment, the insulating layer 15 may have a planarization function or reduce the corrosion of a metal layer (not shown) provided on the substrate 10, which may increase the durability of the sealing structure 100.

In some embodiments, the second functional layer 16 may include at least one inorganic layer 16-1 and at least one an alignment layer 16-2. For example, the inorganic layer 16-1 may in direct contact with the insulating layer 15 and may be positioned between the insulating layer 15 and the alignment layer 16-2. In an embodiment, when the sealing structure 100 is included in a liquid crystal display device, the second functional layer 16 which includes the alignment layer 16-2 may arrange the liquid crystal molecules in a substantially predetermined direction, which may improve the performance of the display device. In addition, in some embodiments, the inorganic layer 16-1 and/or the alignment layer 16-2 may include more than one sublayer as well, but it is not limited thereto.

In some embodiments, the material of the inorganic layer of the second functional layer 16 may include an inorganic material, such as silicon oxide, silicon nitride, silicon oxynitride, aluminum oxide, aluminum nitride, aluminum oxynitride, titanium oxide, other suitable materials, or a combination thereof, but it is not limited thereto. The material of the alignment layer of the second functional layer 16 may include, for example, polystyrene (PS), polyimide (PI), polyvinyl alcohol (PVA), polyester, epoxy resin, polyurethane (PU), polysilane (PS), etc. In some embodiments, the second functional layer 16 may be disposed on the insulating layer 15 by a process that is identical or similar to the one used in the first functional layer 14, which will not be repeated here.

In some embodiments, for example, the second functional layer 16 in the non-sealant region 2 of the display area D or the periphery N may be positioned between two electrodes (not shown), and then extended to the sealant region 1 of the peripheral area N. The electrodes may be transparent electrodes, such as indium tin oxide (ITO), indium gallium zinc oxide (IGZO), a combination thereof, other conductive materials or low resistance materials, or a combination thereof, but the disclosure is not limited thereto. It should be noted that the cross-sectional view shown in FIG. 4 is just an example of a fringe field switching (FFS) architecture, and the present disclosure is not limited thereto. In some embodiments, other structures or layers may be disposed on the substrate 10, depending on design requirements.

Figure 5:
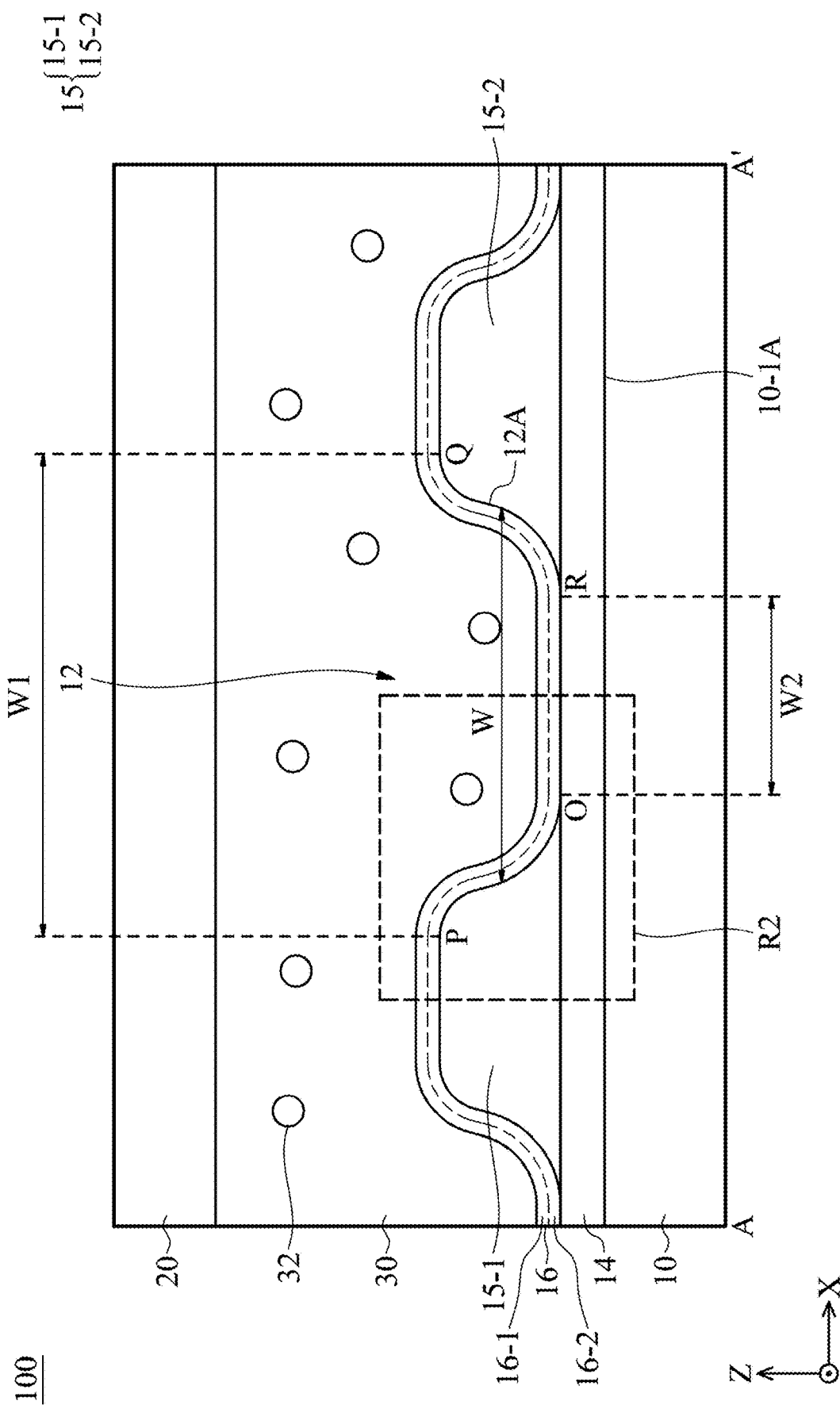
FIG. 5 is a cross-sectional view of some elements of the sealing structure illustrated along the line A-A' in some embodiments of the present disclosure.
Figure 6:
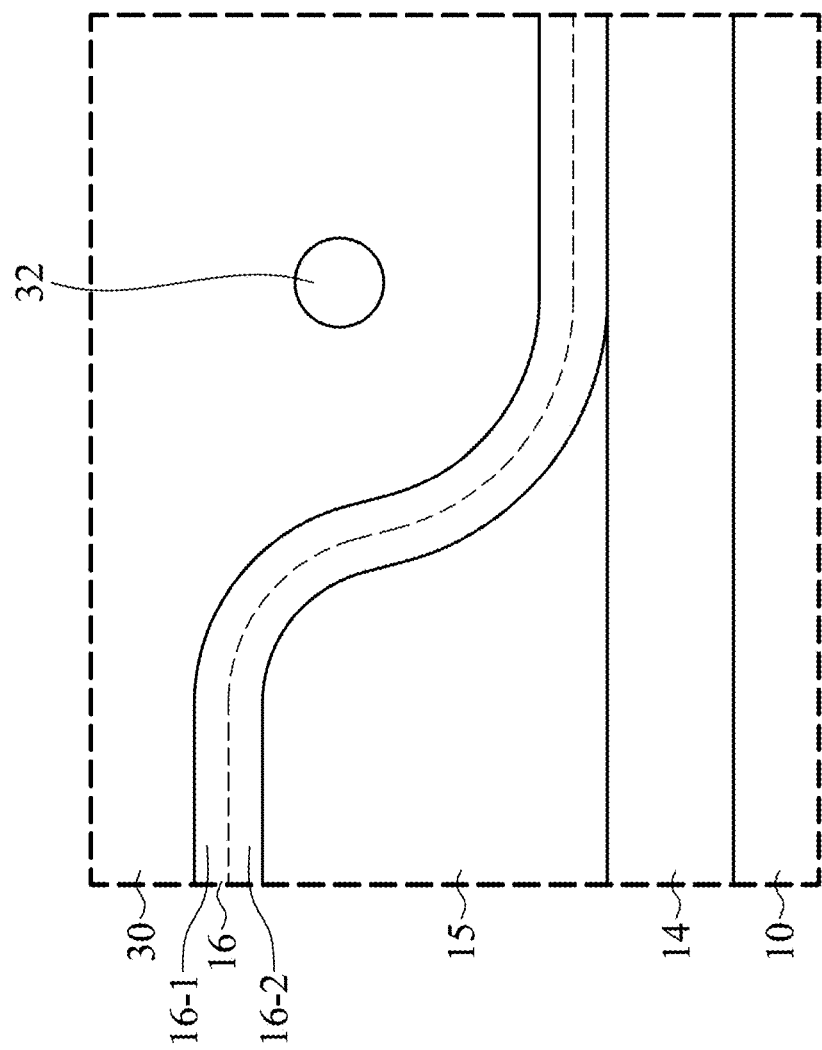
FIG. 6 is an enlarged view of the region R2 in FIG. 5

FIG. 5 is a cross-sectional view of some elements of the sealing structure 100 illustrated along the line A-A' in FIG. 3 according to some embodiments of the present disclosure, and FIG. 6 is an enlarged view of the area R2 in FIG. 5. In some embodiments, referring to FIG. 3, the recess structure 11 also may be formed on the insulating layer 15. In detail, as shown in FIG. 5 and FIG. 6, the recess 12 may be formed on the insulating layer 15. For example, the recess 12 may be formed by etching the insulating layer 15, but it is not limited thereto. In addition, the second functional layer 16 may be formed in the recess 12. In detail, the second functional layer 16 may be formed in the recess 12 means that a portion of the second functional layer 16 is in the recess 12.

The sealing material 30 may include a plurality of filler particles 32. In some embodiments, as shown in FIG. 5 and FIG. 6, at least a portion of the filler particles 32 may be accommodated in the recess 12. The filler particles 32 may include insulating materials, such as organic or inorganic materials. The inorganic materials may include silicon oxide, silicon dioxide, silicon nitride, silicon oxynitride, aluminum oxide, aluminum nitride, aluminum oxynitride, titanium oxide, and zinc oxide, other suitable materials, or a combination thereof, but not limited thereto. The organic materials may include polyimide (PI), polyethylene terephthalate (PET), polyethylene (PE), polyether sock (PES), polycarbonate (PC), polymethyl methacrylate (PMMA), isoprene, phenolic resin, benzocyclobutene (BCB), perfluorocyclobutane (PECB), or a combination thereof, but it is not limited thereto. The coefficient of thermal expansion (CTE) of the sealing material 30 may be different than other elements in contact with the sealing material 30, such as the substrate 10 and the substrate 20. In some embodiments, the coefficient of thermal expansion of the filler particles 32 may be less than the coefficient of thermal expansion of the sealing material 30. The inclusion of filler particles 32 in the sealing material 30 may reduce the coefficient of thermal expansion of the sealing material 30 to let the sealing material 30 stably bond to the substrate 10 (or substrate 20) when the temperature changes, and increasing the mechanical strength of the sealing structure 100. In addition, by providing the filler particles 32 in the recess 12, the bonding strength between the sealing material 30 and the substrate 10 may be further enhanced, which is particularly advantageous for electronic devices with narrow bezels.

In some embodiments, the recess 12 may have a bowl shape in a cross-sectional view as shown in FIG. 5. For example, the recess 12 has a width of W1 at the top portion that is farther away from the substrate 10. In this embodiment, the width W1 is defined as the distance between the highest point of the insulating layer 15-1 and the highest point of the insulating layer 15-2 that is adjacent to the insulating layer 15-1 in Z direction. For example, as shown in FIG. 5, the distance between the point P and the point Q in the X direction is the width W1. The width at the bottom of the recess 12 is W2. In this embodiment, the width W2 is defined as the minimum distance between the lowest point of the insulating layer 15-1 and the lowest point of the insulating layer 15-2 that is adjacent to the insulating layer 15-1. For example, as shown in FIG. 5, the distance between the point O and the point R in the X direction is the width W2, wherein the width W1 is greater than the width W2. In another embodiment, the width W of any recess 12 away from the top surface 10-1A of the substrate 10 is greater than the width W2. In other words, the width of the recess 12 may gradually increase from its bottom to the Z direction. In this way, the filler particles 32 may be easily accommodated in the recess 12, and the mechanical strength of the sealing structure 100 may be further increased.

In addition, although the sealing material 30 at the recess 12 is illustrated in direct contact with the second functional layer 16, but the disclosure is not limited thereto. For example, in some embodiments, the second functional layer 16 may not be disposed on at the recess 12, so that the sealing material 30 may be direct contact with the first functional layer 14 or the insulating layer 15, but the present disclosure is not limited thereto. "An layer may not be disposed on the recess" in this disclosure may mean that the layer is not directly disposed on the recess, or the layer is only partially disposed on the recess. For example, referring to FIG. 5, the second functional layer 16 does not disposed on the recess 12 means that the second functional layer 16 is not directly disposed on the recess 12. Alternatively, it also may be a portion of the second functional layer 16 being disposed on the recess 12, such as the second functional layer 16 is only disposed on the sidewall 12A of the recess 12, but not disposed on the bottom of the recess 12, such embodiment also may be referred to the second functional layer 16 does not disposed on the recess 12. In addition, in some embodiments, the first functional layer 14 and the insulating layer 15 may be recessed to form the recess 12. In other words, the recess 12 may be formed by the first functional layer 14 and the insulating layer 15, and the surface top 10-1A of the substrate 10 may be exposed from the recess 12 to allow the sealing material 30 being in contact with the top surface 10-1A of the substrate 10, but the disclosure is not limited thereto, depending on design requirements. In another embodiment, the recess 12 may be formed by at least one insulating layer, or by at least one insulating layer plus at least one metal layer, but it is not limited thereto, depending on design requirements. In another embodiment, a metal layer (e.g., wires, pads, etc.) may be optionally disposed in the recess 12.

Other layers may be disposed between the substrate 20 and the sealing material 30. For example, a shielding matrix layer, a color filter layer, a functional layer, an alignment layer, other suitable layers or a combination thereof also may be disposed on the substrate 20, but it is not limited thereto. In some embodiments, the shielding matrix layer, the color filter layer, the functional layer, and the alignment layer may be sequentially arranged on the base, where the alignment layer may in contact with the sealing material 30, but it is not limited thereto. The functional layer disposed on the substrate 20 may, for example, planarize the substrate 20, but it is not limited thereto. In some embodiments, the material of the base of the substrate 20 may include glass, quartz, ceramics, sapphire, polycarbonate (PC), polyimide (PI), polypropylene (PP), polyethylene terephthalate (PET), other suitable materials, or a combination thereof, but it is not limited thereto. The the substrate 20 may flexible or inflexible.

In some embodiments, the alignment layer disposed on the substrate 20 may not extend into or position in the sealant region 1 of the substrate 20. Referring to FIG. 2B and FIG. 5, the recess structure 21 may be positioned at a suitable position on the substrate 20. For example, the recess structure 21 may be formed on the color filter layer to expose the shielding matrix layer, so that at least a portion of the sealing material 30 may in direct contact with the shielding matrix layer of the substrate 20, but it is not limited thereto. In other embodiments, on the substrate 20, the alignment layer may be disposed in the seal region 1 of the substrate 20, and a recess structure 21 may be formed in the shielding matrix layer, that is, the sealing material 30 may in direct contact with the alignment layer disposed on the substrate 20, but it is not limited thereto. In some embodiments, the shielding matrix layer disposed on the substrate 20 may be hollowed to make the recess structure 21 and expose the substrate 20, so that the sealing material 30 may in direct contact with the substrate 20, but it is not limited thereto. In addition, in other embodiments, the recess structure 21 may be formed on the functional layer disposed on the substrate 20, depending on design requirements.

Figure 7:
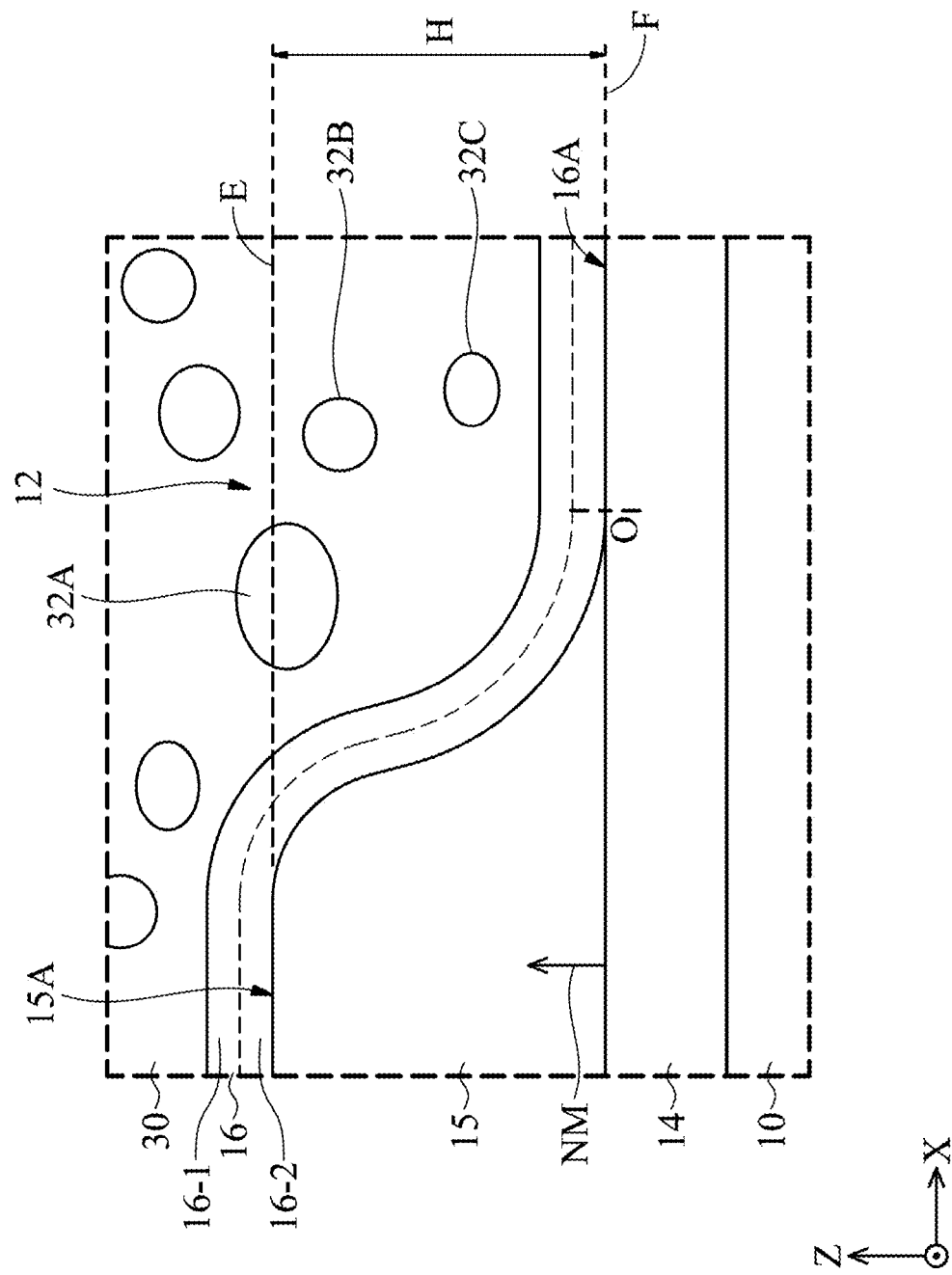
FIG. 7 is an enlarged cross-sectional view of some elements of the sealing structure in some embodiments of the present disclosure.

In some embodiments, as shown in FIG. 5 and FIG. 6, the filler particles 32 may have identical or substantially identical shapes and/or size, but the present disclosure is not limited thereto. In this embodiment, the size of the filler particle means the measured maximum diameter or the maximum width of the filler particle in the cross-section (e.g. XZ plane). The filler particles may have different size and/or dimensions. For example, FIG. 7 is an enlarged cross-sectional view of some elements of the sealing structure 100 according to some embodiments of the present disclosure. As shown in FIG. 7, the filler particle 32A, the filler particle 32B, and the filler particle 32C may include different shapes, or may include different sizes as well, depending on design requirements. Because the filler particles have different shapes and sizes, the sealing material will have a different supporting forces and elasticity, which may enhance the overall mechanical strength of the sealing material.

It should be noted that "the filler particles accommodated in the recess" herein may include embodiments of "completely accommodated in" or "partially accommodated in". For example, in FIG. 7, the surface of the insulating layer 15 away from the substrate 10 in the Z direction is referred to as the top surface 15A, and the top surface 15A has an extension line E in the first direction. An interface 16A may be included between the first functional layer 14 and the second functional layer 16, the horizontal extension line E of the top surface 15A may pass through the filler particle 32A, and the filler particle 32B and the filler particle 32C may be positioned between the extension line E and the interface 16A. It should be noted that in the present disclosure, the filler particle 32A, the filler particle 32B, and the filler particle 32C may be defined as "accommodated in the recess 12", as long as at least a portion of the filler particle is located between the extension line E of the top surface 15A and an extension line F of the interface 16A, the filler particle may be defined as being accommodated in the recess 12. If the interface between the first functional layer 14 and the second functional layer 16 is a rough interface, the extension line that corresponds to an approximate extension direction of the rough interface in the cross-sectional view is defined as the extension line F. For example, in FIG. 7, the approximate extension direction of the interface between the first functional layer 14 and the second functional layer 16 is the X direction.

As shown in FIG. 7, in some embodiments, at least a portion of the recess 12 has a depth H. It should be noted that if other layers (e.g., the second functional layer 16) are also disposed on the first functional layer 14 that is disposed on the recess 12, the direction of the depth H may be defined as the normal direction NM of an interface between the first functional layer 14 and the insulation layer 15. Alternatively, in some embodiments, if no additional layer is disposed on the bottom of the recess 12, for example, the aforementioned first functional layer 14 and second functional layer 16, the direction of the depth H may be defined as the normal direction of the substrate 10, such as Z direction.

In addition, a depth H of the recess 12 may be defined as 95% of the maximum distance from the top surface 15A to the first functional layer 14 in the direction of the depth H (for example, the Z direction or the NM direction). As shown in FIG. 7, the recess 12 may accommodate at least two filler particles in the direction of the depth H (for example, the Z direction in FIG. 7), such as the filler particle 32B and the filler particle 32C, where the filler particle 32B at least partially overlaps the filler particle 32C in the Z direction. That is, the depth H may be more than twice the size of the filler particle 32B or the filler particle 32C. For example, in some embodiments, the sizes of the aforementioned filler particles may be less than about 1 μm, and the depth H may be greater than about 2 μm, but it is not limited thereto. In some embodiments, the depth H may be greater than or equal to 3 times the size of the aforementioned filler particles and less than or equal to 4 times the size of the aforementioned filler particles, but it is not limited thereto. Thereby, the sealing material 30, which includes the filler particle 32A, the filler particle 32B, or the filler particle 32C, may be substantially filled into the recess 12, or the space between the sealing material 30 and the recess 12 may be reduced (such as substantially free of spaces) to increase the bonding strength of the sealing material 30 to the recess 12. In another embodiment, if the depth H is less than about 3.7 times the size of the filler particles, the bonding strength between the sealing material 30 and the recess 12 may be reduced. In yet another embodiment, if the depth H is greater than about 3.9 times the size of the filler particles, the sealing material 30 may not easily flow into the recess 12 to reduce the bonding strength between the sealing material 30 and the recess 12. In another embodiment, the sizes of the filler particle 32A, the filler particle 32B, or the filler particle 32C may be greater than or equal to 0.6 μm, and less than or equal to 0.85 μm. In other words, in the sealing material 30, the size of at least one of the filler particles may be greater than or equal to 0.6 μm, and less than or equal to 0.85 μm.

Figure 8:
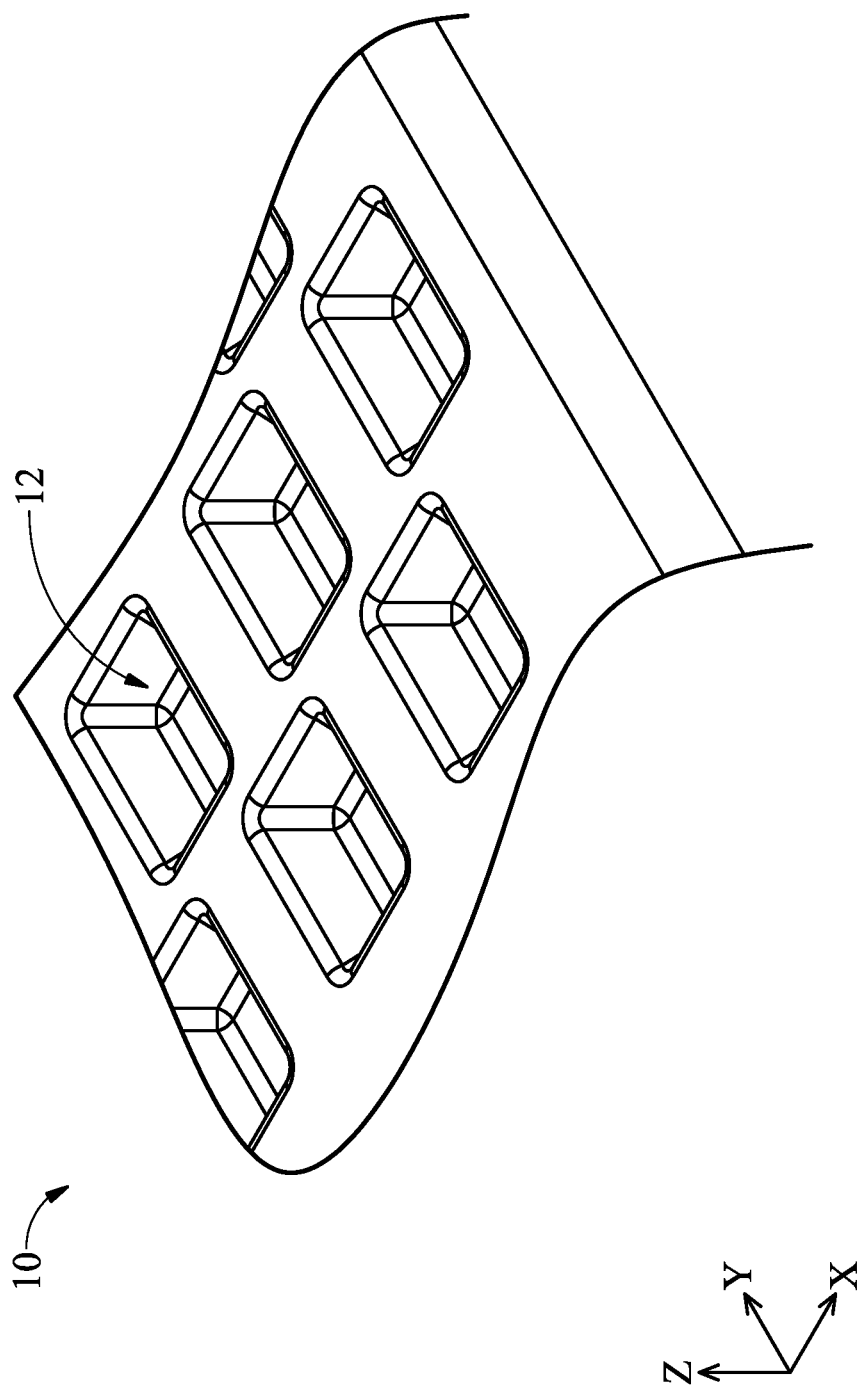
FIG. 8 is a schematic view of the substrate in some embodiments of the present disclosure.

FIG. 8 is a schematic diagram of a substrate 10 and the recess 12 disposed on the substrate 10 according to some embodiments of the present disclosure. The recess 12 in FIG. 8 is similar to the recess in FIG. 5, so please also refer to FIG. 5. As shown in FIG. 5 and FIG. 8, the recess 12 may be in a bowl shape, that is, the size of the recess 12 may be gradually reduced from a side that is away from the substrate 10 to a side that is closer to the substrate 10. In this way, the filler particles may be more easily filled into the recess structure, and the mechanical strength of the sealing structure 100 may be further increased. In addition, the width W1 of the top portion of the recess 12 in the horizontal direction (for example, in the X direction) may also be greater than the size of the filler particles. In addition, the minimum size of the bottom of the recess 12 (for example, the size W2 in FIG. 5) in the horizontal direction (for example, the X direction) also may be greater than the size of the filler particles. In this way, the filler particles also may be filled into the recess structure more easily, which further increases the mechanical strength of the sealing structure 100.

In summary, a sealing structure is provided. The sealing structure includes two substrates opposite each other, each of which has a sealing region on its periphery. The recess structure has at least one recess in the sealing region of at least one of the two substrates. The sealing material has filler particles, which is disposed along the sealing regions to seal the two substrates, wherein some of the filler particles are accommodated in the recess. By accommodating the filler particles in the recess, the bonding strength of the sealing material and the recess structure may be increased, or the mechanical strength of the sealing structure may be enhanced.

The sealing structure in the foregoing embodiment of the present disclosure may also be integrated with other electronic apparatuses to serve as an electronic device. Alternatively, the electronic device may have touch control function to act as a touch electronic device. Furthermore, the electronic device or touch electronic device may be applied in any electronic device that requires a screen, such as display, mobile phone, watch, notebook, video camera, photographic camera, mobile navigator, television, etc. However, the devices are merely examples, and the applications of the present disclosure are not limited thereto. The touch electronic device in the embodiments of the present disclosure may also be used in an antenna having touch control function or other electronic devices.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. An electronic device, comprising:
    a substrate comprising an edge, a display area and a peripheral area disposed between the edge and the display area;
    a first inorganic insulating layer disposed on the substrate;
    an organic insulating layer disposed on the first inorganic insulating layer, and having a recess in the peripheral area, wherein in a top view, the recess extends in a first direction parallel to the edge of the substrate; and
    a second inorganic insulating layer disposed on the organic insulating layer and in the recess,
    wherein in a cross-sectional view, the recess has a bottom portion adjacent to the substrate, and a width of the bottom portion of the recess is greater than a thickness of the organic insulating layer, and
    wherein the organic insulating layer and the second inorganic insulating layer are in contact with a top surface of the first inorganic insulating layer.

2. The electronic device as claimed in claim 1, wherein the organic insulating layer has another recess in the peripheral area, and the another recess is located between the recess and the edge of the substrate.

3. The electronic device as claimed in claim 2, wherein the another recess extends in the first direction, and in the cross-sectional view, the another recess has another bottom portion, and a width of the another bottom portion of the another recess is greater than the thickness of the organic insulating layer.

4. The electronic device as claimed in claim 1, further comprising a metal layer disposed in the recess.

5. The electronic device as claimed in claim 1, further comprising an organic material disposed in the recess, wherein the second inorganic insulating layer is located between the organic insulating layer and the organic material.

6. The electronic device as claimed in claim 1, wherein the second inorganic insulating layer comprises an inorganic layer and an alignment layer.

7. The electronic device as claimed in claim 1, wherein a thickness of the second inorganic insulating layer is less than the thickness of the organic insulating layer.

* * * * *